United States Patent
Matsuda et al.

(10) Patent No.: US 8,729,776 B2
(45) Date of Patent: May 20, 2014

(54) ELECTRONIC COMPONENT WITH METAL CEILING

(75) Inventors: Takashi Matsuda, Tokyo (JP); Kazunori Inoue, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/556,897

(22) Filed: Jul. 24, 2012

(65) Prior Publication Data

US 2013/0062995 A1   Mar. 14, 2013

(30) Foreign Application Priority Data

Sep. 8, 2011   (JP) .................................. 2011-196067

(51) Int. Cl.
  *H01L 41/08*   (2006.01)
  *H03H 9/10*    (2006.01)

(52) U.S. Cl.
  CPC .................................. *H03H 9/1071* (2013.01)
  USPC ...................... 310/344; 310/313 R

(58) Field of Classification Search
  USPC ................... 310/313, 340, 344; 333/193–196
  See application file for complete search history.

(56) References Cited

U.S. PATENT DOCUMENTS

| 7,142,435 | B2 * | 11/2006 | Goto et al. ............... 361/818 |
| 7,259,500 | B2 * | 8/2007  | Iwamoto et al. ........... 310/340 |
| 8,531,254 | B2 * | 9/2013  | Yamaji et al. ............. 333/193 |
| 2006/0103003 | A1 * | 5/2006  | Heide et al. ............... 257/700 |
| 2006/0238274 | A1 * | 10/2006 | Huang et al. .............. 333/193 |
| 2010/0314245 | A1 * | 12/2010 | Brown et al. ............ 204/192.15 |
| 2012/0223789 | A1 * | 9/2012  | Inoue et al. ............... 333/193 |
| 2012/0280768 | A1 * | 11/2012 | Nakayama et al. ......... 333/193 |

FOREIGN PATENT DOCUMENTS

| JP | 9-326447 A |   | 12/1997 |
| JP | 2008-227748 A |   | 9/2008 |
| JP | 2009218762 A | * | 9/2009 |
| JP | 2010-157956 A |   | 7/2010 |
| JP | 2010157956 A | * | 7/2010 |

* cited by examiner

*Primary Examiner* — Jaydi San Martin
(74) *Attorney, Agent, or Firm* — Chen Yoshimura LLP

(57) ABSTRACT

An electronic component includes: a substrate; a functional element located on the substrate; a wiring located on the substrate and electrically connected to the functional element; a metal ceiling located above the functional element so that a space is formed between the metal ceiling and the functional element; and a sealing portion located on the metal ceiling, wherein the metal ceiling is electrically connected to a signal wiring that is included in the wiring and transmits a high-frequency signal.

8 Claims, 15 Drawing Sheets

US 8,729,776 B2

ELECTRONIC COMPONENT WITH METAL CEILING

CROSS-REFERENCE TO RELATED APPLICATION

This application is based upon and claims the benefit of priority of the prior Japanese Patent Application No. 2011-196067, filed on Sep. 8, 2011, the entire contents of which are incorporated herein by reference.

FIELD

A certain aspect of the present invention relates to an electronic component.

BACKGROUND

Acoustic wave devices are used as a filter, a duplexer or the like included in mobile communications terminals. As acoustic wave resonators, there are a surface acoustic wave (SAW) resonator using a surface acoustic wave, a boundary acoustic wave resonator using a boundary wave, a Film Bulk Acoustic Resonator (FBAR) using a piezoelectric thin film and the like. A functional element which excites an acoustic wave is an electrode such as an IDT (Inter Digital Transducer) in the surface acoustic wave device for example, and is a region in which electrodes sandwiching a piezoelectric thin film overlap in the FBAR. In the acoustic wave device, to excite the acoustic wave effectively, there is a case that an air-space is formed above an acoustic wave element.

For example, Japanese Patent Application Publication No. 2008-227748 discloses an invention in which an acoustic wave element is sealed with a strengthening layer made of an epoxy resin and a metal so that a space is formed above an acoustic wave element. Japanese Patent Application Publication No. 2010-157956 discloses an invention in which an acoustic wave element is sealed with a top panel made of copper. Japanese Patent Application Publication No. 9-326447 discloses an invention in which an acoustic wave element is sealed with a thermoplastic resin.

However, when a ceiling made of metal (metal ceiling) located above the functional element is connected to ground, characteristics of the electronic component are degraded.

SUMMARY OF THE INVENTION

According to an aspect of the present invention, there is provided an electronic component including: a substrate; a functional element located on the substrate; a wiring located on the substrate and electrically connected to the functional element; a metal ceiling located above the functional element so that a space is formed between the metal ceiling and the functional element; and a sealing portion located on the metal ceiling, wherein the metal ceiling is electrically connected to a signal wiring that is included in the wiring and transmits a high-frequency signal.

DETAILED DESCRIPTION

Figure 1A:
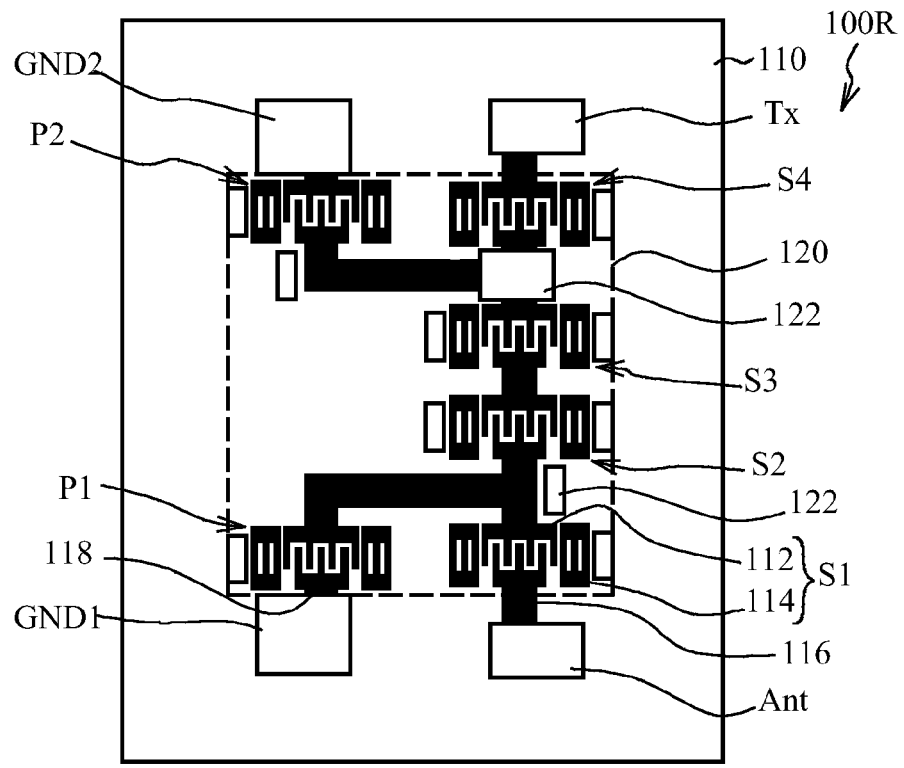
FIG. 1A and FIG. 1B are plain views illustrating a ladder-type filter in accordance with a first comparative example.
Figure 1B:
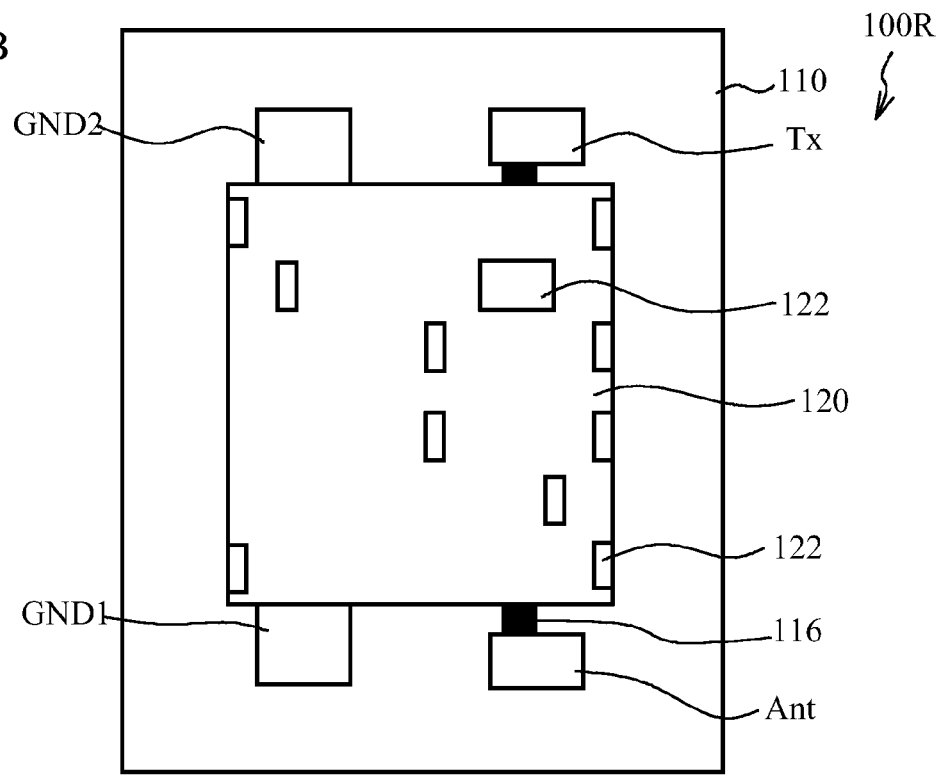
Figure 2:
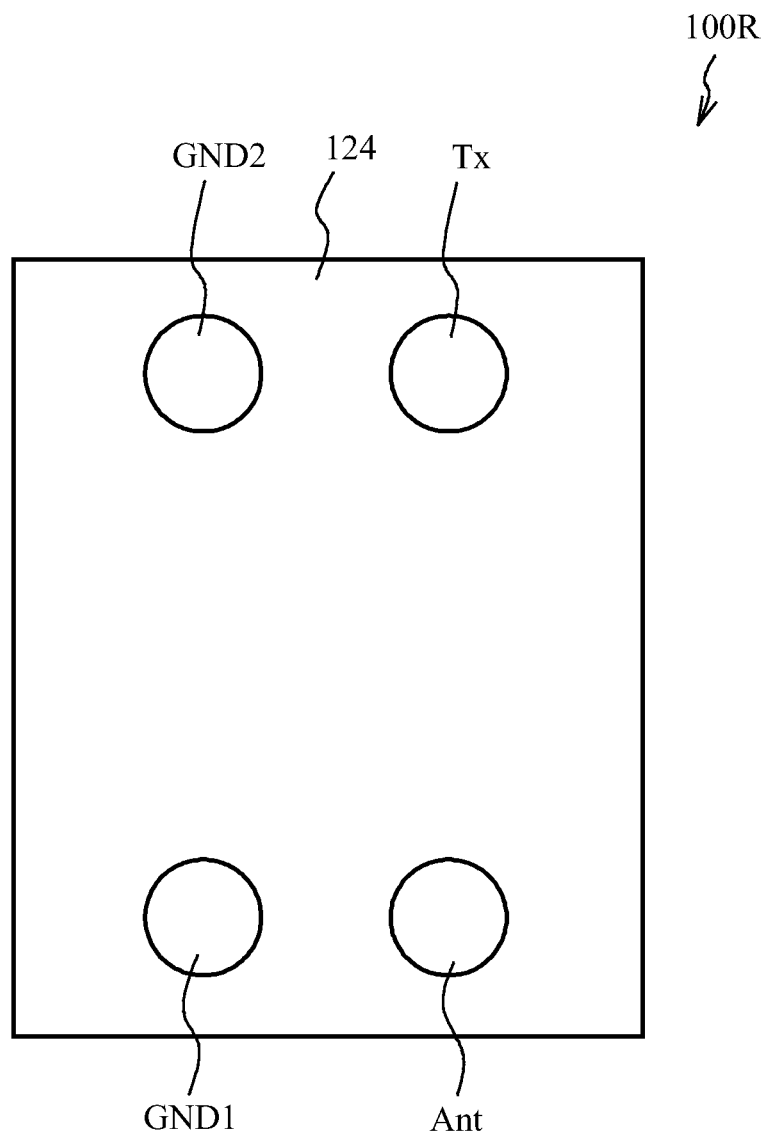
FIG. 2 is a plain view illustrating the ladder-type filter in accordance with the first comparative example.

To define the problem to be solved by embodiments, a description will be given of a first comparative example first. The first comparative example is an example in which a metal ceiling is connected to ground. FIG. 1A through FIG. 2 are plain views of a ladder-type filter in accordance with the first comparative example. FIG. 1A is a plain view in which a sealing portion and the metal ceiling in FIG. 2 are illustrated transparently. FIG. 1B is a plain view in which the sealing portion in FIG. 2 is illustrated transparently. A rectangle illustrated with a dashed line represents a metal ceiling 120 in FIG. 1A. In the drawings, a numeral 116 is affixed to one of signal wirings, and a numeral 122 is affixed to two of support posts, one being located in the vicinity of a series resonator S1 and the other being located on the signal wiring 116. Terminals included in the ladder-type filter include an undercoat layer, a columnar terminal, and a solder ball. In FIG. 1A, undercoat layers are illustrated. In FIG. 1B, columnar terminals are illustrated. In FIG. 2, solder balls are illustrated.

As illustrated in FIG. 1A through FIG. 2, series resonators S1 through S4, parallel resonators P1 and P2, signal wirings 116, grounding wirings 118, and support posts 122 are located in an upper surface of a piezoelectric substrate 110 of a ladder-type filter 100R. Resonators S1 through S4, P1 and P2 are arranged in a ladder shape. Series resonators S1 through S4 are connected in series between an antenna terminal Ant and a transmission terminal Tx by signal wirings 116. One end of the parallel resonator P1 is connected in parallel between series resonators S1 and S2 by the signal wiring 116, and the other end is electrically connected to a ground terminal GND1 by the grounding wiring 118. One end of the parallel resonator P2 is connected in parallel between series resonators S3 and S4, and the other end is electrically connected to a ground terminal GND2. Resonators are SAW resonators including an IDT 112 and reflection electrodes 114. The IDT 112 is made of comb-shaped electrodes facing each other, and excites an acoustic wave. Reflection electrodes 114 are located at both sides of the IDT 112 along the propagation direction of the acoustic wave, and reflect the acoustic wave.

Support posts 122 are located away from and insulated from resonators and signal wirings 116. In addition, the support post 122 located on the signal wiring 116 is insulated from the signal wiring 116 by an insulation layer (not illustrated) made of an insulating material such as silicon nitride (SiN).

As illustrated in FIG. 1B, the metal ceiling 120 is located above the piezoelectric substrate 110 so that it overlaps with resonators, terminals and wirings. The metal ceiling 120 contacts upper surfaces of support posts 122, and is supported by support posts 122. The metal ceiling 120 is electrically connected to support posts 122, ground terminals GND1 and GND2, and is located away from and insulated from resonators, signal wirings 116, and terminals Ant and Tx.

FIG. 2 is a diagram illustrating an upper surface of the ladder-type filter without illustrating a sealing portion 124 transparently. As illustrated in FIG. 2, the sealing portion 124 is located on the entire portion of the piezoelectric substrate 110 so that it covers the metal ceiling 120, and seals resonators, wirings and terminals. Solder balls protrude from apertures that pierce through the sealing portion 124. Solder balls function as an external connection terminal connecting an electronic component and an external device.

The passband of the ladder-type filter 100R is determined by the resonance frequency and the anti-resonance frequency of the resonator. The ladder-type filter 100R passes signals having a frequency within the passband, and suppresses signals having a frequency outside the passband. A high-frequency or RF signal is input to the transmission terminal Tx. Signal wirings 116 transmit the high-frequency signal. The antenna terminal Ant interconnects the ladder-type filter 100R and an unillustrated antenna, and outputs the high-frequency signal that has passed through the ladder-type filter 100R.

Figure 3A:
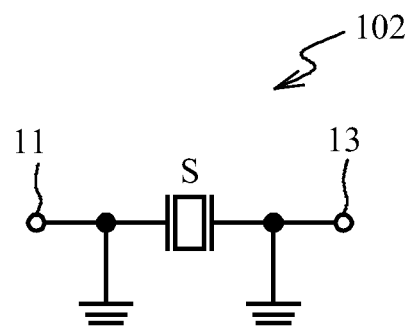
FIG. 3A and FIG. 3B are circuit diagrams illustrating a circuit used for a simulation.
Figure 3B:
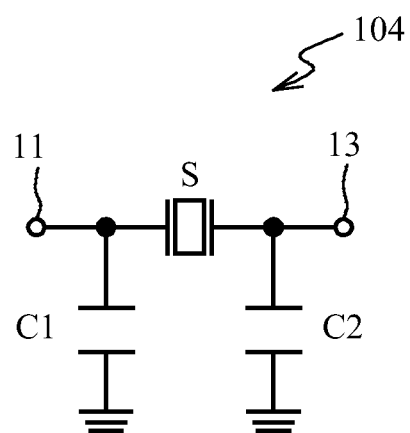

A description will now be given of the degradation of frequency characteristics in the ladder-type filter. The cause of the degradation in frequency characteristics includes the formation of capacitors between the metal ceiling 120 and resonators and that between the metal ceiling 120 and wirings. As illustrated in FIG. 1B, since the metal ceiling 120 is connected to ground terminals GND1 and GND2, capacitances are formed in parallel between resonators and ground terminals GND1 and GND2. To examine the change of frequency characteristics of the ladder-type filter caused by the formation of the capacitance, a simulation is performed. FIG. 3A and FIG. 3B are circuit diagrams illustrating a circuit used for the simulation.

As illustrated in FIG. 3A, in a circuit 102, a resonator S is connected in series between a port 11 and a port 13. A wiring between the resonator S and the port 11 and a wiring between the resonator S and the port 13 are connected to ground. As illustrated in FIG. 3B, a circuit 104 includes capacitors C1 and C2 (hereinafter, referred to as C1 and C2). One end of the C1 is connected between one end of the resonator S and the port 11. One end of the C2 is connected between the other end of the resonator S and the port 13. The other ends of the C1 and the C2 are connected to ground. The C1 and the C2 have a capacitance of 0.5 pF. The resonator S is a SAW resonator in which an IDT is located on the piezoelectric substrate made of 42-degree rotated Y-cut lithium tantalate ($LiTaO_3$). The C1 and the C2 correspond to capacitances formed by the metal ceiling 120 in FIG. 1B.

Figure 4A:
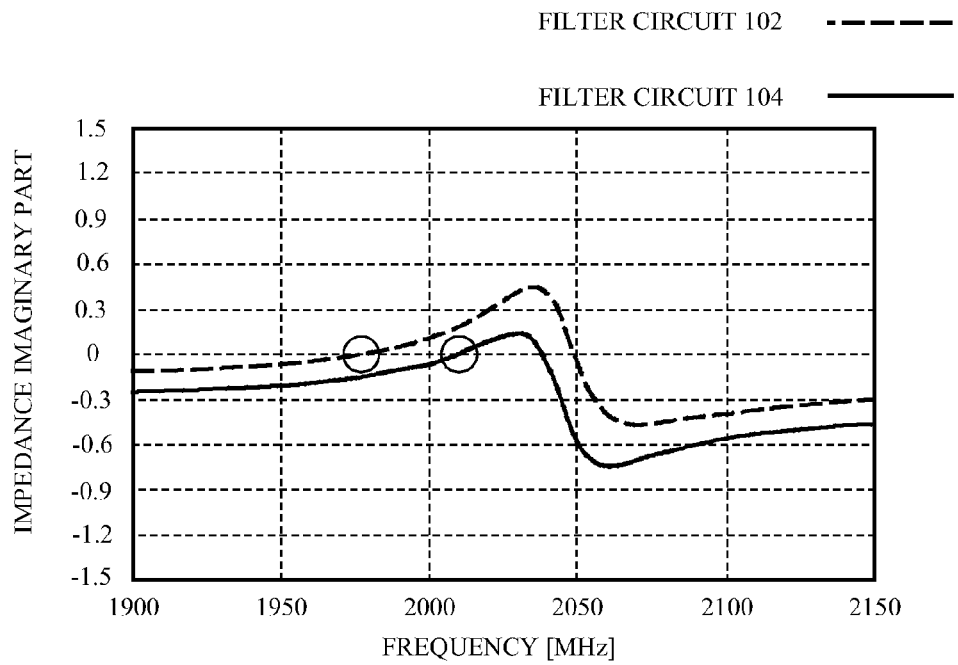
FIG. 4A is a graph depicting calculation results of impedances in a case where a signal is input to a port 11 and a signal is output from the port 11.
Figure 4B:
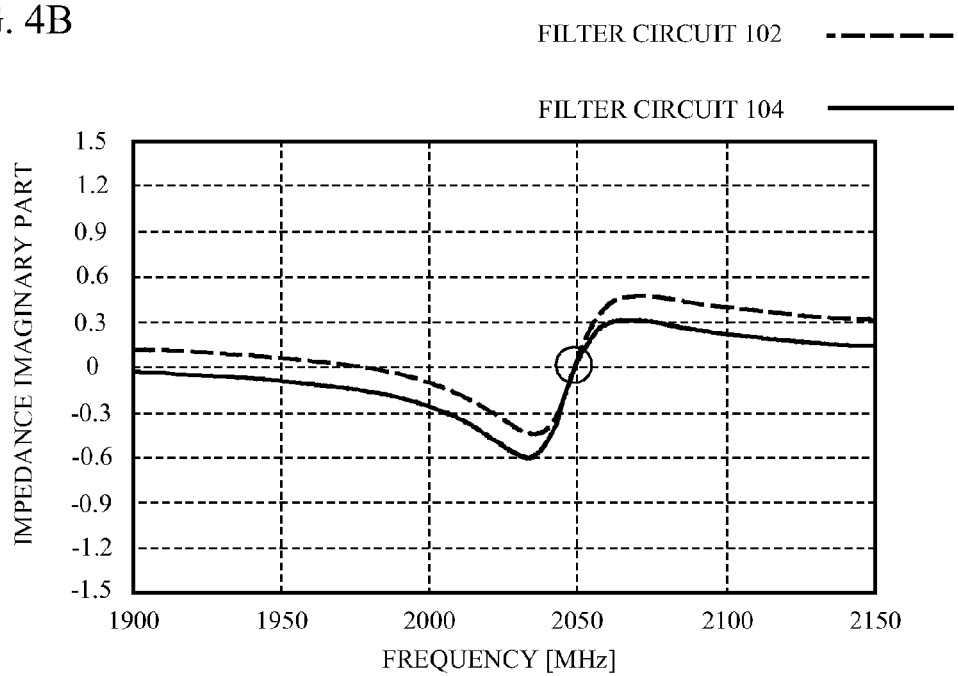
FIG. 4B is a graph depicting calculation results of impedances in a case where a signal is input to a port 13 and a signal is output from the port 11.

By calculating respective imaginary parts of impedances (impedance imaginary parts) of the circuit 102 and the circuit 104, changes of the resonance frequency and the anti-resonance frequency caused by the addition of the capacitance are examined. The resonance frequency of the circuit is defined as a frequency at which the impedance imaginary part changes to positive from negative in a case where the signal is input to the port 11 and the signal is output from the port 11. The anti-resonance frequency of the circuit is defined as a frequency at which the impedance imaginary part changes to positive from negative in a case where the signal is input to the port 13 and the signal is output from the port 11. FIG. 4A is a graph depicting calculation results of impedances in a case where the signal is input to the port 11 and the signal is output from the port 11. FIG. 4B is a graph depicting calculation results of impedances in a case where the signal is input to the port 13 and the signal is output from the port 11. A horizontal axis represents a frequency, and a vertical axis represents an impedance imaginary part. Dashed lines represent the impedance imaginary part of the circuit 102, and solid lines represent the impedance imaginary part of the circuit 104.

As circled in FIG. 4A, the resonance frequency of the circuit 102 is approximately 1980 MHz. The resonance frequency of the circuit 104 is approximately 2010 MHz. As circled in FIG. 4B, the anti-resonance frequency of the circuit 102 and the anti-resonance frequency of the circuit 104 are approximately 2050 MHz. As seen, by the addition of the C1 and the C2, the resonance frequency is shifted to the high frequency side.

As described previously, frequency characteristics of the ladder-type filter are defined by the resonance frequency and the anti-resonance frequency of the resonator. The shift of the resonance frequency illustrated in FIG. 4A becomes the cause of the degradation of characteristics in the passband of the ladder-type filter. In addition, the passband of the ladder-type filter becomes narrow. To widen the bandwidth of the ladder-type filter, the electromechanical coupling factor $k^2$ of the piezoelectric substrate should be made large for example. However, $k^2$ is a material value determined by the material. Thus, it is difficult to control $k^2$ to a desired value. As described above, since the metal ceiling 120 is connected to grounding wirings and the additional capacitance is formed, characteristics of the electronic component such as the ladder-type filter are degraded.

First Embodiment

Figure 5A:
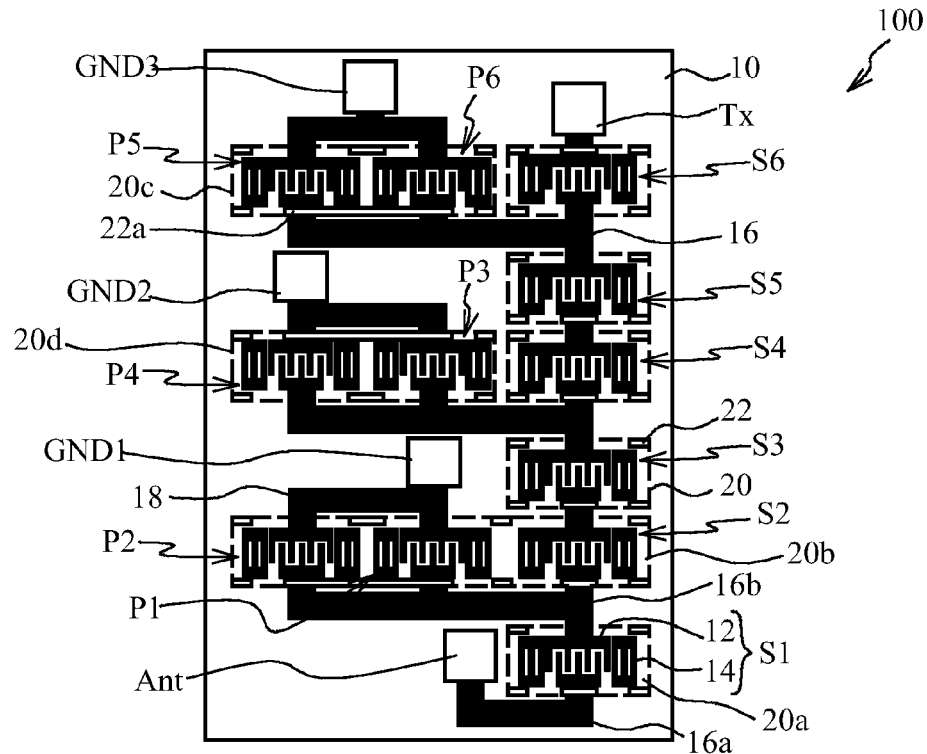
FIG. 5A and FIG. 5B are plain views illustrating a ladder-type filter in accordance with a first embodiment.
Figure 5B:
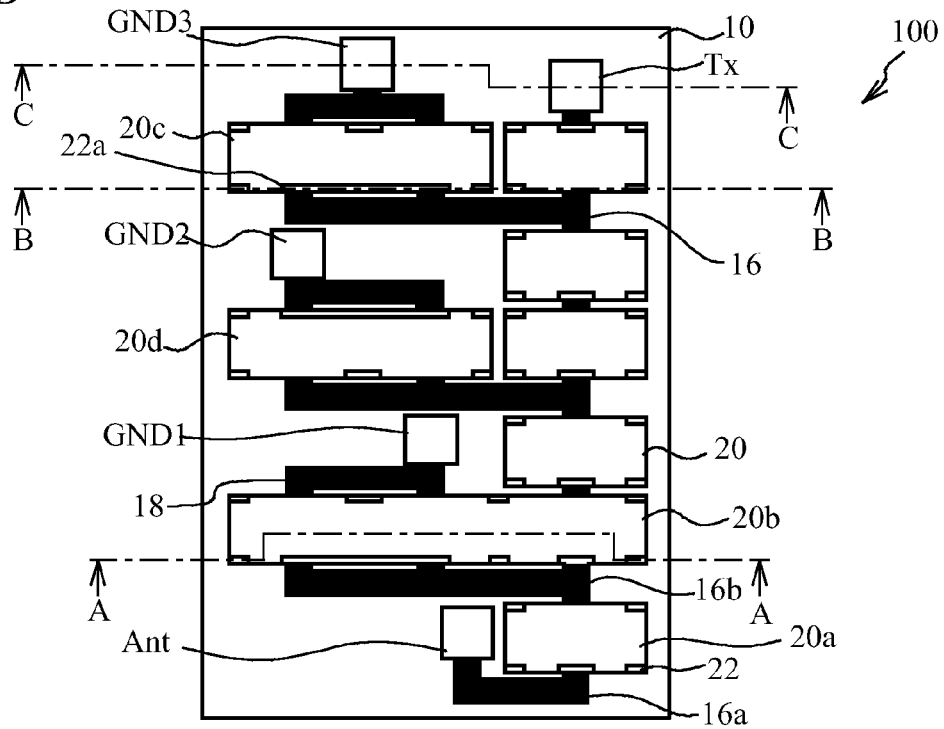
Figure 6A:
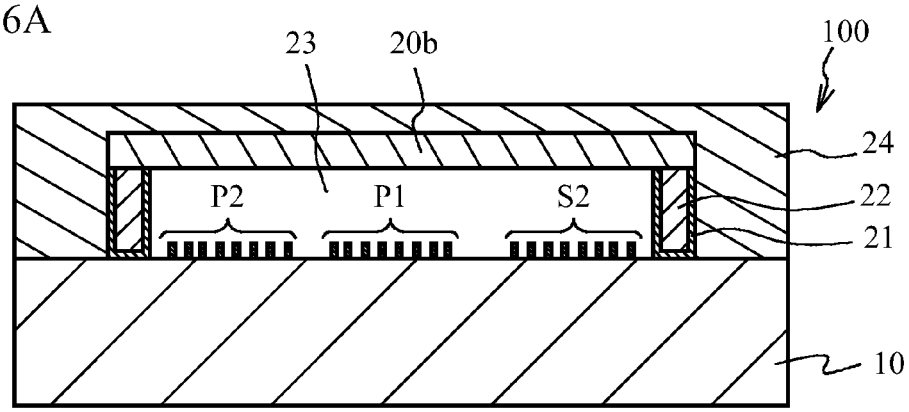
FIG. 6A through FIG. 6C are cross-sectional views illustrating the ladder-type filter in accordance with the first embodiment.
Figure 6B:
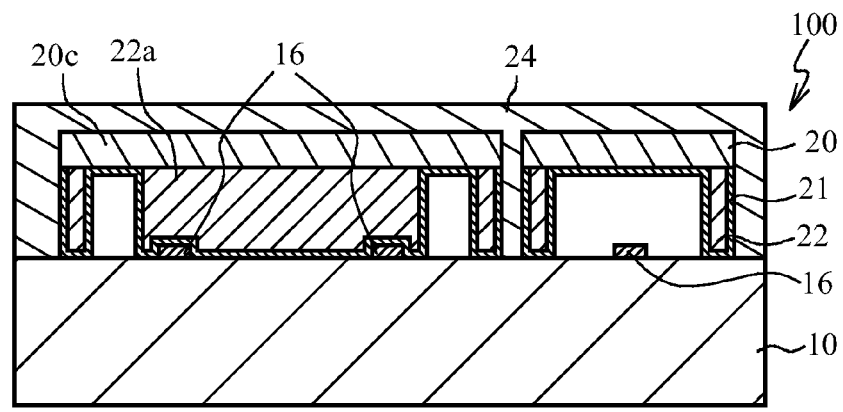
Figure 6C:
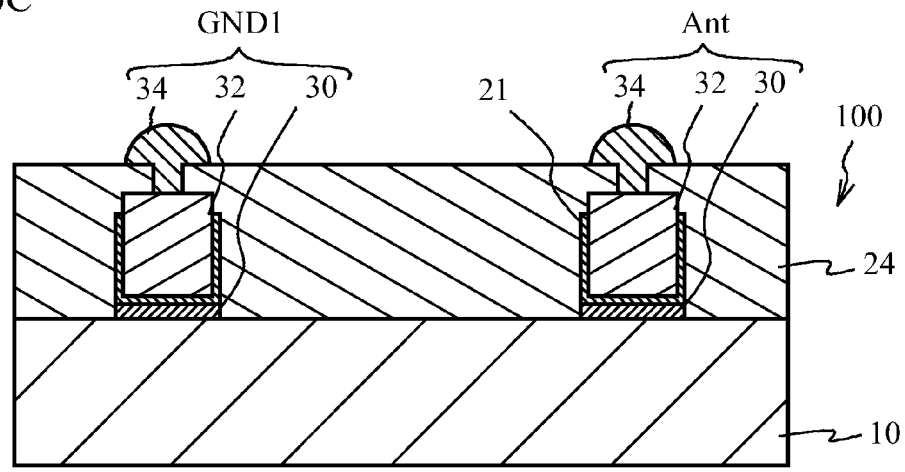
Figure 7:
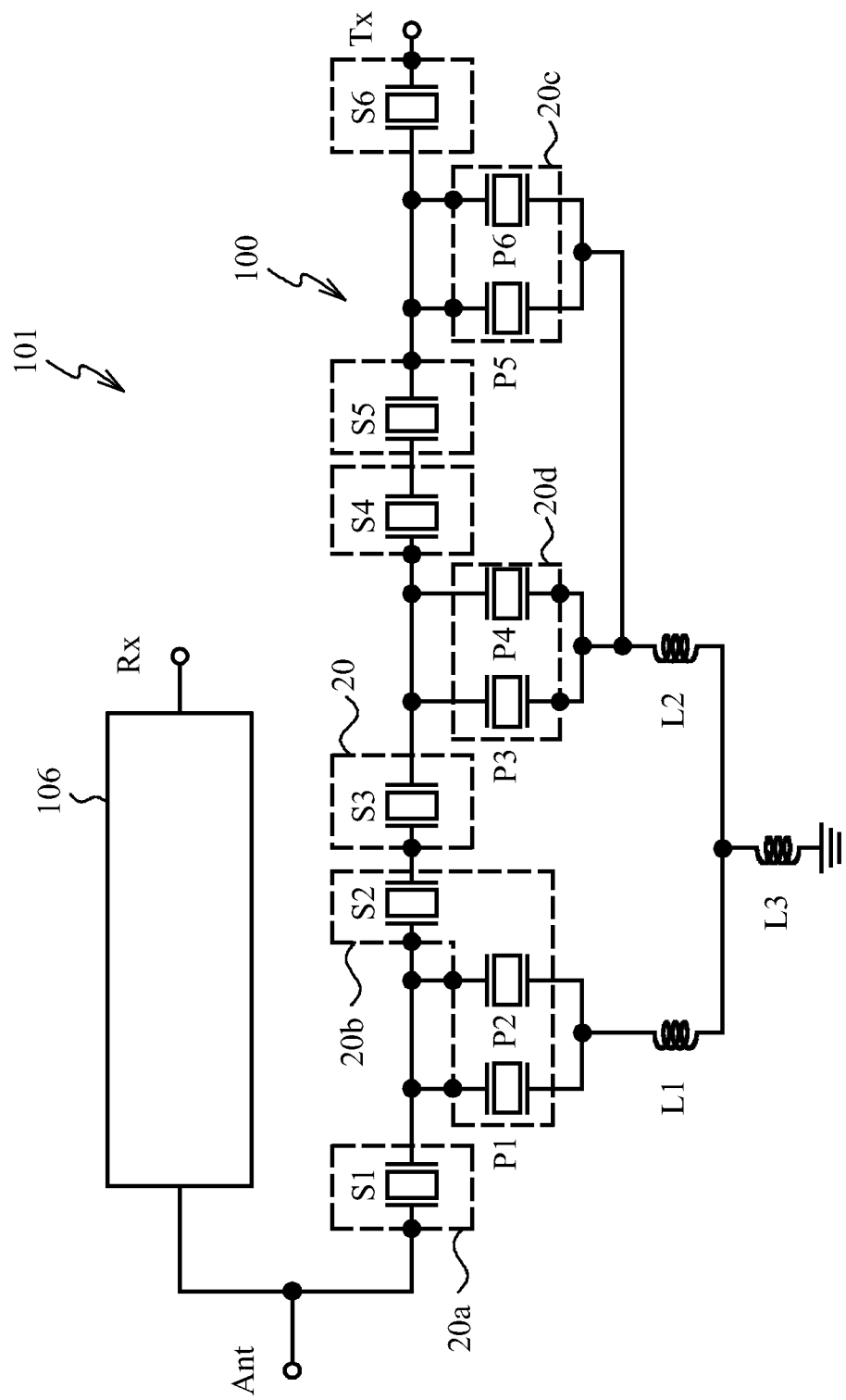
FIG. 7 is a diagram illustrating the ladder-type filter in accordance with the first embodiment.

A first embodiment is an embodiment in which a metal ceiling is electrically connected to a signal wiring. A description will be given of a structure of a ladder-type filter in accordance with the first embodiment. FIG. 5A and FIG. 5B are plain views illustrating the ladder-type filter in accordance with the first embodiment. The illustration of the plain view corresponding to FIG. 2 is omitted, because the plain view is same as FIG. 2 except that the number of terminals is different. FIG. 6A through FIG. 6C are cross-sectional views illustrating the ladder-type filter in accordance with the first embodiment. FIG. 6A is a cross-section taken along polygonal line A-A in FIG. 5B, FIG. 6B is a cross-section taken along line B-B in FIG. 5B, and FIG. 6C is a cross-section taken along polygonal line C-C in FIG. 5B. FIG. 7 is a diagram illustrating a duplexer including the ladder-type filter in accordance with the first embodiment. A transmission filter of a duplexer 101 is a ladder-type filter 100 in accordance with the first embodiment. One end of the ladder-type filter 100 and one end of a reception filter 106 are connected to the antenna terminal Ant. The other end of the reception filter 106 is connected to the reception terminal Rx. Inductors L1 through an L3 are included in an evaluation board, a printed circuit board or the like for example. Rectangles illustrated with dashed lines in FIG. 7 represent metal ceilings 20. A black circle located at the intersection of the dashed line with the solid line represents that the metal ceiling 20 is connected to the wiring. In the drawings, the illustration of the transmission filter and elements such as a circuit associated with the antenna terminal Ant is omitted.

As illustrated in FIG. 5A, FIG. 5B and FIG. 7, in the ladder-type filter 100 in accordance with the first embodiment, series resonators S1 through S6 are connected in series between the antenna terminal Ant and the transmission terminal Tx. One ends of parallel resonators P1 and P2 are connected in parallel between series resonators S1 and S2, and the other ends are connected to the ground terminal GND1. In the same manner, parallel resonators P3 and P4 are connected between series resonators S3 and S4, and connected to the ground terminal GND2. Parallel resonators P5 and P6 are connected between series resonators S5 and S6, and connected to the ground terminal GND3. As illustrated in FIG. 7, in the duplexer 101, parallel resonators P1 and P2 are connected to one end of the L1. Parallel resonators P3 through P6 are connected one end of the L2. The other ends of the L1 and the L2 are connected to one end of the L3. The other end of the L3 is connected to ground.

As illustrated in FIG. 5A, resonators S1 through S6 and P1 through P6 are SAW resonators including an IDT 12 and reflection electrodes 14. As illustrated in FIG. 5A and FIG. 5B, signal wirings 16 connect one resonator to another resonator, and connect resonators to signal terminals. A signal wiring included in signal wirings 16 and connecting the antenna terminal Ant to the series resonator S1 is referred to as a signal wiring 16a (a first wiring). A signal wiring included in signal wirings 16 and connecting the series resonator S1 to resonators S2, P1 and P2 is referred to as a signal wiring 16b (a second wiring). In the drawings, signal wirings to which numerals are not affixed are referred to as signal wirings 16. In metal ceilings 20, the one located above the series resonator S1 is referred to as a metal ceiling 20a, the one located above resonators S2, P1 and P2 is referred to as a metal ceiling 20b, the one located above parallel resonators P5 and P6 is referred to as a metal ceiling 20c, and the one located above parallel resonators P3 and P4 is referred to as a metal ceiling 20d. Metal ceilings to which numerals are not affixed in the drawings are referred to as metal ceilings 20.

The metal ceiling 20d is connected to a grounding wiring 18 that connects parallel resonators P3 and P4 to the ground terminal GND2. Metal ceilings 20, 20a, 20b and 20c other than the metal ceiling 20d are not connected to grounding wirings 18 or ground terminals GND1 through GND3, and are connected to signal wirings 16. Thus, capacitances that metal ceilings 20 form between resonators and wirings and ground terminals GND1 through GND3 are reduced. As a result, according to the first embodiment, the shift of the resonance frequency illustrated in FIG. 5A is suppressed, and the degradation of frequency characteristics of the ladder-type filter is suppressed.

As illustrated in FIG. 5A, FIG. 5B and FIG. 7, the metal ceiling 20a included in metal ceilings 20 is connected to the signal wiring 16a and is not connected to the signal wiring 16b. Thus, the short circuit between the signal wiring 16a and the signal wiring 16b is suppressed. In the same manner, other metal ceilings 20 are connected to wirings connected to one ends of resonators under metal ceilings 20, and are not connected to wirings connected to the other ends of resonators.

As illustrated in FIG. 5A through FIG. 6A, as the metal ceiling 20b is supported by support posts 22, a space 23 is formed above resonators S2, P1 and P2. Support posts 22 have a height of 1 to 30 μm for example. Other resonators are also exposed to the space 23. As a sealing portion 24 is made of a resin or the like having a high viscosity, the flow into the inside of the metal ceiling 20b is suppressed, and the space 23 is secured. Thus, the excitation of the acoustic wave by the resonator is not suppressed. The support post 22 contacts a seed metal 21. The seed metal 21 is used as an electrical supply line in the electrolytic plating method by which the support post 22 and a columnar terminal 32 are formed, and after the electrolytic plating, it becomes a part of the support post 22 and the columnar terminal 32.

As illustrated in FIG. 5A and FIG. 5B, support posts 22 are located at four corners of and positions along sides of the metal ceiling 20, and the like. Thus, the metal ceiling 20 is strongly supported. As illustrated in FIG. 6B, a support post 22a that is included in support posts 22 supporting the metal ceiling 20c and has a widest width contacts signal wirings 16, and mechanically supports the center area of the cross-section of the metal ceiling 20c. Thus, the metal ceiling 20c is strongly supported. For example, in a process for forming the sealing portion 24, a pressure is added to the metal ceiling 20. According to the first embodiment, as illustrated in FIG. 6B, as the center area of the side of the rectangle formed by the metal ceiling 20 and support posts 22 is strongly supported by the support post 22a, the rectangle is not easily crushed. Therefore, the space 23 above resonators is secured.

As illustrated in FIG. 5A and FIG. 5B, two of support posts 22 supporting the metal ceiling 20c are connected to the signal wiring 16 (a third wiring) that is connected in common with parallel resonators P5 and P6. As support posts 22 are connected to the same wiring, the short circuit between wirings is suppressed, and the metal ceiling 20c is more strongly supported.

As illustrated in FIG. 6A through FIG. 6C, the sealing portion 24 contacts, adheres to, and covers the side surface and the upper surface of the metal ceiling 20b and the side surface of the support post 22. Accordingly, the moisture resistance of the ladder-type filter 100 is increased. As illustrated in FIG. 6C, terminals Ant and GND1 include an undercoat layer 30, the columnar terminal 32 and a solder ball 34. The undercoat layer 30 is located on a piezoelectric substrate 10. The seed metal 21 is located on the undercoat layer 30, and the columnar terminal 32 is provided so as to be covered by the seed metal 21. The solder ball 34 is located on the columnar terminal 32 so as to be exposed from the sealing portion 24. Terminals Tx, GND2 and GND3 have a same structure.

Figure 8:
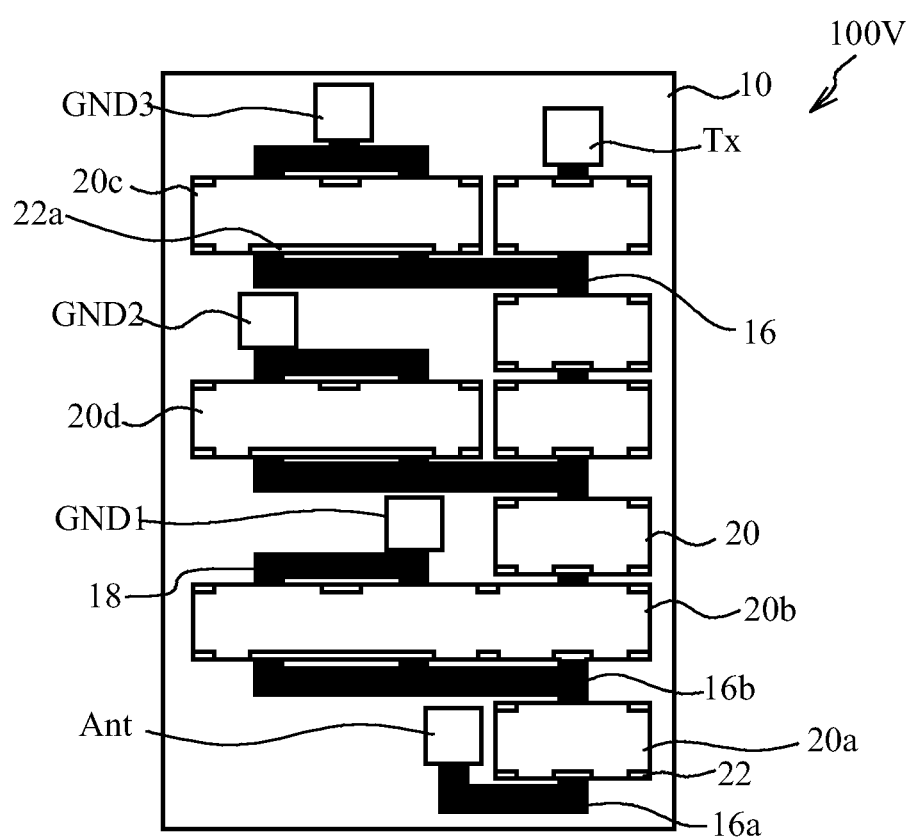
FIG. 8 is a plain view illustrating a ladder-type filter in accordance with a variation of the embodiment of the first embodiment.

A description will now be given of a variation of the first embodiment. FIG. 8 is a plain view illustrating a ladder-type filter in accordance with the variation of the first embodiment. A description of a structure already described in FIG. 5A through FIG. 6C is omitted.

As illustrated in FIG. 8, the metal ceiling 20d is connected to the signal wiring 16, and is not connected to the grounding wiring 18. By connecting all the metal ceilings 20 included in a ladder-type filter 100V to signal wirings 16, it is possible to reduce the capacitances between resonators and ground terminals GND1 through GND3. In addition, for example, it is possible that more than two metal ceilings 20 are connected to grounding wirings 18 and more than one metal ceiling 20 is connected to the signal wiring 16. As described, it is sufficient if at least one of metal ceilings 20 is connected to the signal wiring 16.

The piezoelectric substrate 10 is made of a piezoelectric substance such as lithium tantalate (LiTaO$_3$) and lithium niobate (LiNbO$_3$) for example. The IDT 12, reflection electrodes 14, signal wirings 16, grounding wirings 18, and the undercoat layer 30 are made of a metal film of which material is aluminum (Al) and the like. Metal ceilings 20, support posts 22, and columnar terminals 32 are made of a metal such as copper (Cu) for example. Using Cu or an alloy including Cu as a material, it is possible to form metal ceilings 20, support posts 22, and columnar terminals 32 easily by the electrolytic plating method. In addition, as the difference of thermal expansion coefficient between the metal ceiling 20 and the piezoelectric substrate 10 becomes smaller, the deformation of the piezoelectric substrate 10 is suppressed, and the reliability of the ladder-type filter is increased. The solder ball 34 is made of solder such as tin silver (SnAg) for example. The sealing portion 24 is made of a liquid crystal polymer, a resin such as polyimide, or an insulating material other than a resin. As the liquid crystal polymer has a high adhesiveness to Cu, it is preferable to use the liquid crystal polymer as the sealing portion 24.

As series resonators S1 through S6 are not connected to grounding wirings 18 and metal ceilings 20 located above series resonators S1 through S6 are connected to signal wirings 16, it is possible to suppress the degradation of frequency characteristics of the ladder-type filter effectively. In the first embodiment, the ladder-type filter is used as an example, but a structure of the embodiment may be applied to a stand-alone resonator, a multimode type filter, a dual filter, a duplexer and the like. In addition, the filter in accordance with the embodiment may be applied to any of the transmission filter and the reception filter of the duplexer. The functional element is an element that achieves the function of the electronic component, and may be an acoustic wave resonator such as a boundary acoustic wave resonator and a piezoelectric thin film resonator in addition to the surface acoustic wave resonator. When the piezoelectric thin film resonator is used, a substrate made of silicon (Si) is used instead of the piezoelectric substrate 10. In addition, instead of the IDT 12, a region in which the upper electrode and the lower electrode, which sandwich the piezoelectric thin film made of a piezoelectric substance, overlap becomes a functional element that excites the acoustic wave. Furthermore, the embodiment can be applied to even the electronic component such as a piezoelectric gyro and an MEMS (Micro Electron Mechanical Systems) which do not use the acoustic wave as long as the electronic component has a necessity to locate the space above the functional element.

Second Embodiment

Figure 9A:
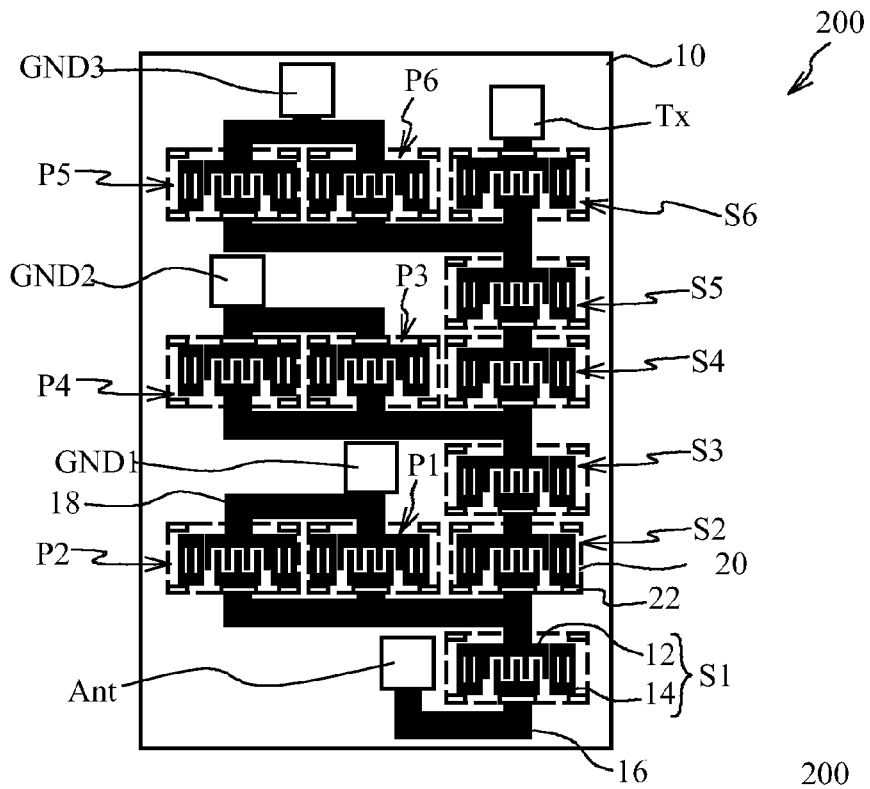
FIG. 9A and FIG. 9B are plain views illustrating a ladder-type filter in accordance with a second embodiment.
Figure 9B:
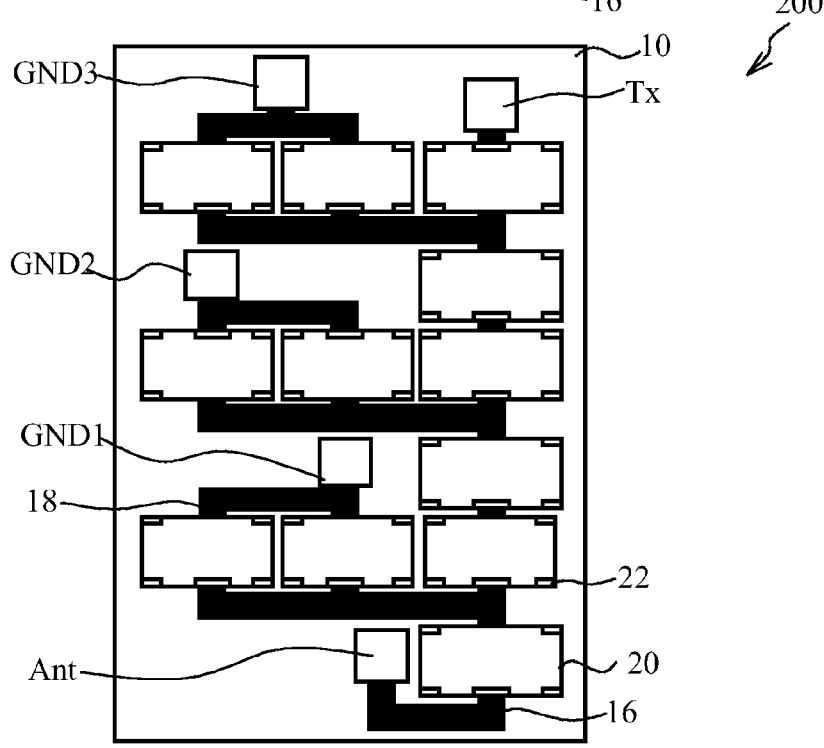

A second embodiment is an embodiment in which the metal ceiling 20 is divided. FIG. 9A and FIG. 9B are plain views illustrating a ladder-type filter in accordance with the second embodiment. A description of a structure previously described in FIG. 5A through FIG. 6C is omitted. As illustrated in FIG. 9A and FIG. 9B, in a ladder-type filter 200 in accordance with the second embodiment, each of metal ceilings 20 is located above a respective one of resonators. Other structures are same as those of the ladder-type filter 100 in accordance with the first embodiment.

A description will now be given of a simulation of frequency characteristics of the ladder-type filter. In the simulation, frequency characteristics are compared between the second embodiment and a second comparative example. The second comparative example is an example in which metal ceilings are connected to ground. A description will be given of a structure of a ladder-type filter in accordance with the second comparative example.

Figure 10A:
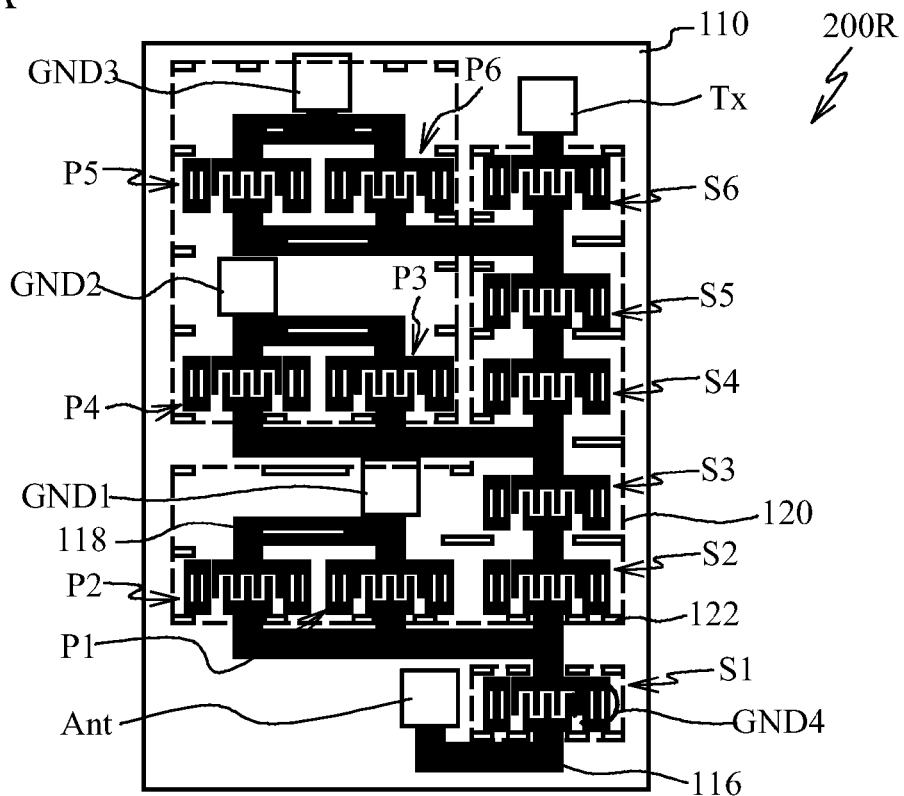
FIG. 10A and FIG. 10B are plain views illustrating a ladder-type filter in accordance with a second comparative example.
Figure 10B:
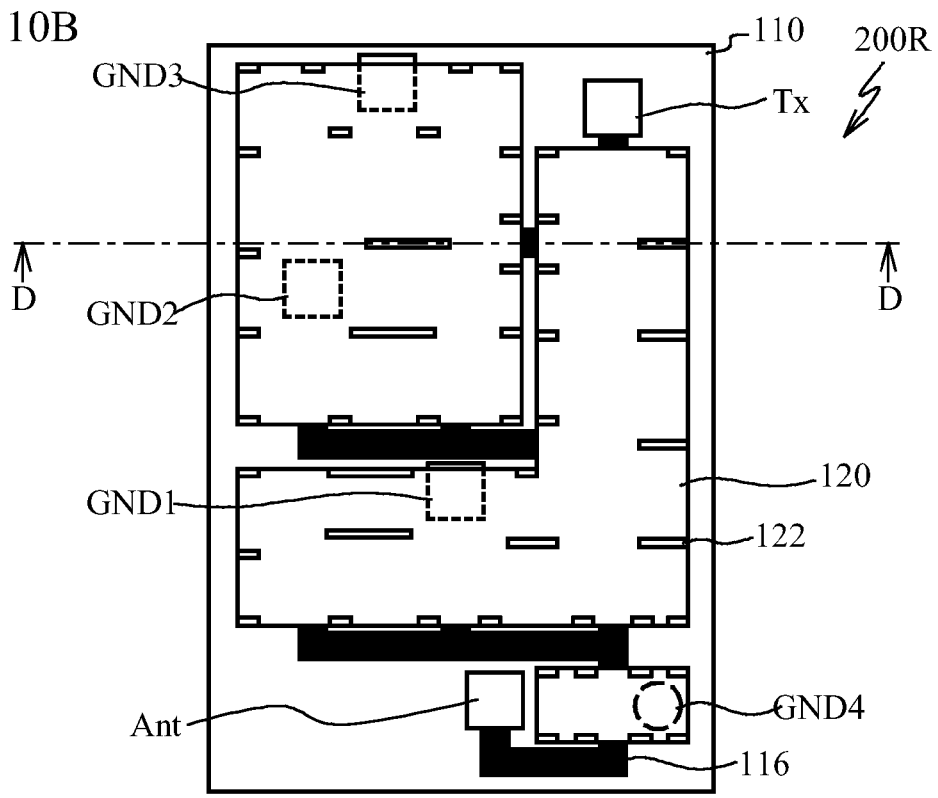
Figure 11:
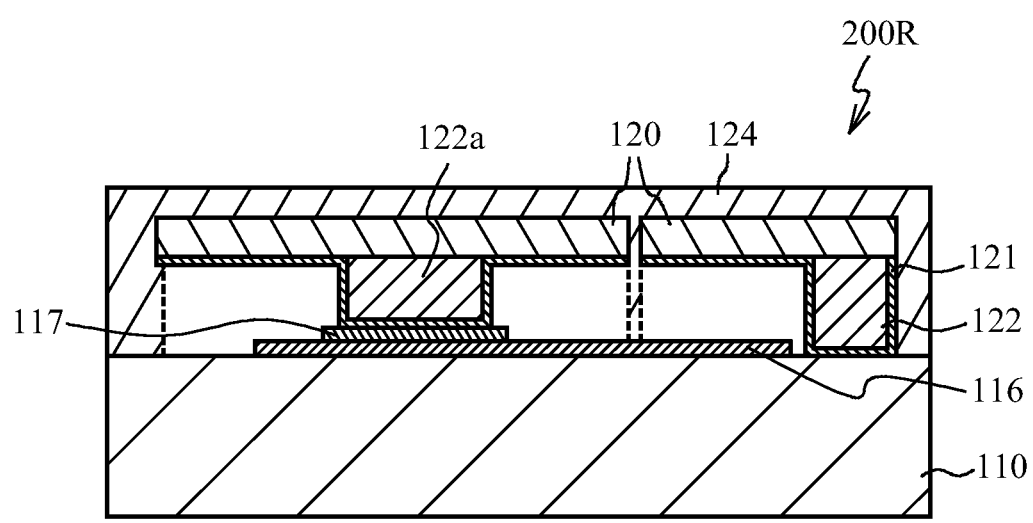
FIG. 11 is a cross-sectional view illustrating the ladder-type filter in accordance with the second comparative example.

FIG. 10A and FIG. 10B are plain views illustrating the ladder-type filter in accordance with the second comparative example. FIG. 11 is a cross-sectional view illustrating the ladder-type filter in accordance with the second comparative example. A white region in the wiring of FIG. 10A represents a support post 122 located on the wiring. As illustrated in FIG. 10A and FIG. 10B, in a ladder-type filter 200R in accordance with the second comparative example, a single metal ceiling 120 is located above the series resonator S1, another single metal ceiling 120 is located above resonators S2 through S6, P1 and P2, and another single metal ceiling 120 is located above parallel resonators P3 through P6. As illustrated with dashed line circles in FIG. 10A and FIG. 10B, the ground terminal GND4, which is made of a solder ball contacting the metal ceiling 120, is located on the series resonator S1. Metal ceilings 120 are not connected to signal wirings 116, and are connected to ground terminals GND1 through GND4. As illustrated with a dotted line in FIG. 10B, one of metal ceilings 120 overlaps with and is bonded to the ground terminal GND1. One of metal ceilings 120 is bonded to ground terminals GND2 and GND3. An insulating layer 117 described later is not illustrated in FIG. 10A or FIG. 10B.

As illustrated in FIG. 11, a single support post 122 and a single seed metal 121 are located on the signal wiring 116. The insulating layer 117 is located between a support post 122a and the signal wiring 116. Thus, the support post 122a and the signal wiring 116 are insulated. The upper surface of the insulating layer 117 has a length and a width larger than the bottom surface of the support post 122a. In addition, although the sealing portion 124 flows into the position illustrated with a dotted line in FIG. 11, as it has a high viscosity, the flow of the sealing portion 124 into the inside of the metal ceiling 120 is greatly suppressed.

A description will now be given of a circuit used for the simulation. The simulation is performed under the configuration where a duplexer including the ladder-type filter 200 in accordance with the second embodiment and a duplexer including the ladder-type filter 200R in accordance with the second comparative example are mounted on the evaluation board. The duplexer supports LTE (Long Term Evolution) Band 1. The LTE Band 1 has a transmission band of 1920 MHz to 1980 MHz.

Figure 12:
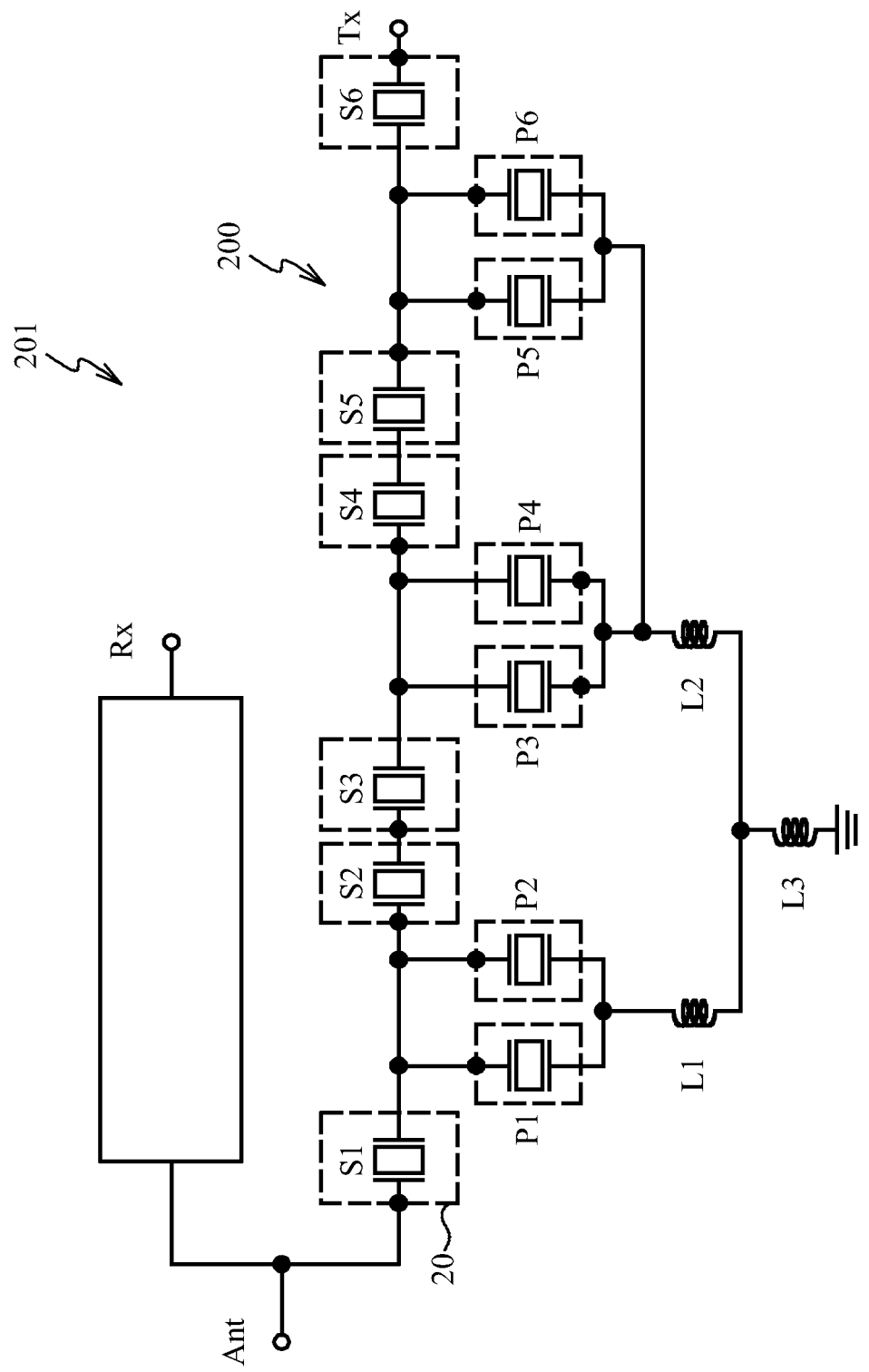
FIG. 12 is a diagram illustrating a duplexer including a ladder-type filter in accordance with a second embodiment.
Figure 13:
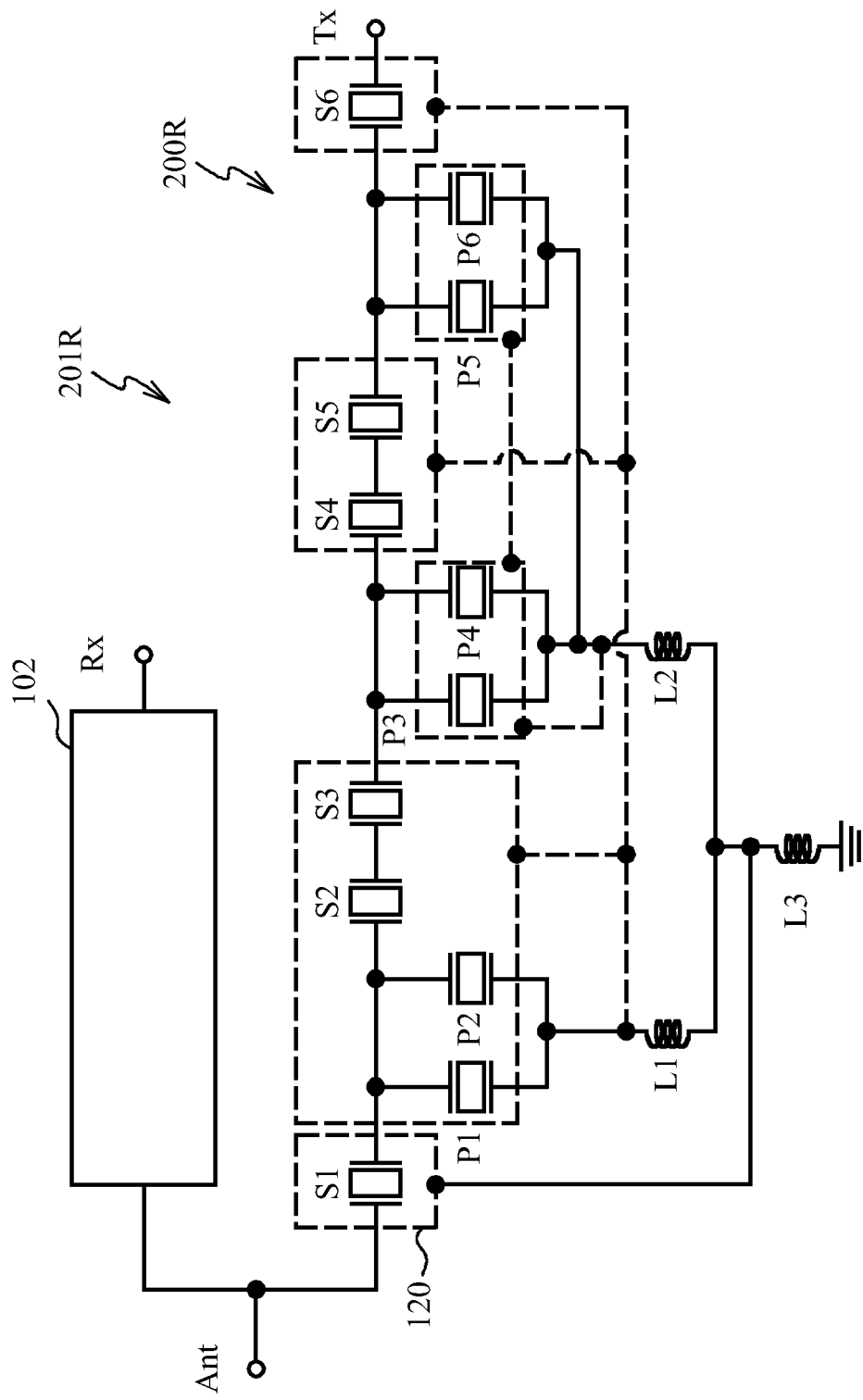
FIG. 13 is a diagram illustrating a duplexer including the ladder-type filter in accordance with the second comparative example.

FIG. 12 is a diagram illustrating a duplexer including the ladder-type filter in accordance with the second embodiment. In FIG. 12 and FIG. 13, the illustration of the transmission filter and elements such as a circuit associated with the antenna terminal Ant is omitted. Dashed lines in the drawings represent metal ceilings 20. As illustrated in FIG. 12, the transmission filter of a duplexer 201 is the ladder-type filter 200 in accordance with the second embodiment. The L1 through the L3 are included in the evaluation board for evaluating the duplexer.

FIG. 13 is a diagram illustrating a duplexer including the ladder-type filter in accordance with the second comparative example. The transmission filter of a duplexer 201R is the ladder-type filter 200R in accordance with the second comparative example. The single metal ceiling 120 in FIG. 10A and FIG. 10B is illustrated by connecting metal ceilings by dashed straight lines in FIG. 13.

Figure 14:
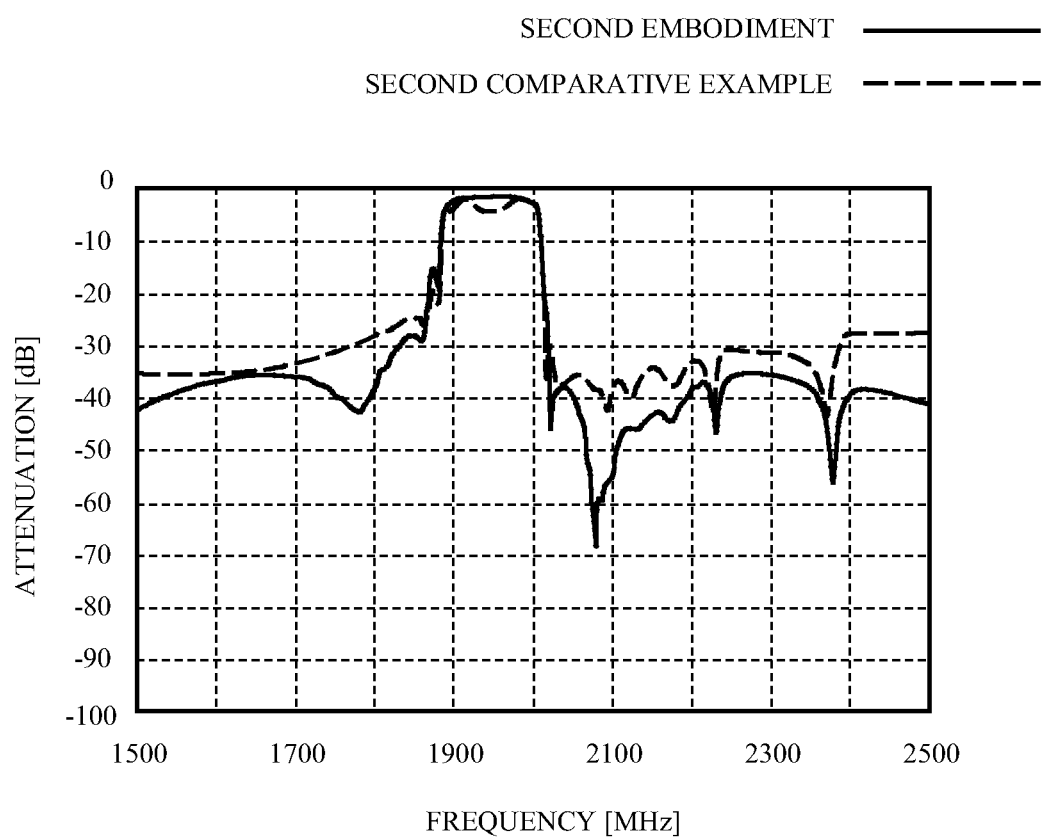
FIG. 14 is a graph depicting calculation results of frequency characteristics of the ladder-type filter.

FIG. 14 is a graph depicting calculation results of frequency characteristics of the ladder-type filter. A horizontal axis represents a frequency, and a vertical axis represents an attenuation. A solid line represents a calculation result in the second embodiment, and a dashed line represents a calculation result in the second comparative example. As illustrated with a dashed line in FIG. 14, in the second comparative example, the attenuation within the passband increases. In addition, the attenuation outside the passband decreases. As shown, in the second comparative example, frequency characteristics are degraded. On the other hand, in the second embodiment, as illustrated with a solid line in FIG. 14, the attenuation within the passband is small and the attenuation outside the passband is large. In addition, in the second embodiment and the second comparative example, the width of the passband is nearly equal. As described above, according to the second embodiment, it is possible to suppress the degradation of characteristics.

As with the second embodiment, each of metal ceilings may be located above a respective one of resonators, or as with the first embodiment, a single metal ceiling may be located above a plurality of resonators. As it is possible to change the number of metal ceiling in accordance with the layout of a resonator, a terminal, a wiring and the like, the possibility of design of the ladder-type filter is expanded.

Third Embodiment

Figure 15A:
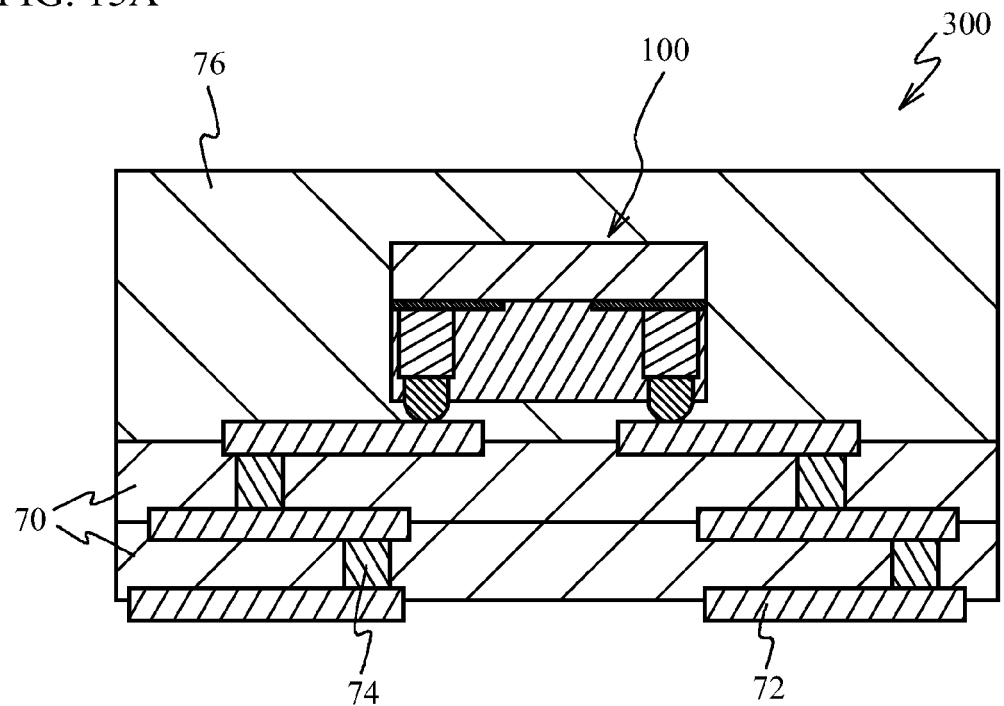
FIG. 15A is a cross-sectional view illustrating a module in accordance with a third embodiment.

A third embodiment is an example of a module in which an electronic component is incorporated. FIG. 15A is a cross-sectional view illustrating a module in accordance with the third embodiment. A cross-section of the ladder-type filter 100 in FIG. 15A is taken along line C-C of FIG. 6B.

As illustrated in FIG. 15A, a module 300 in accordance with the third embodiment includes the ladder-type filter 100, printed circuit boards 70 and a mold resin 76. The printed circuit board 70 is made of a resin for example, and includes wirings 72. A plurality of printed circuit boards 70 are stacked, and wirings 72 are electrically connected each other by via wirings 74. The ladder-type filter 100 is electrically connected to wirings 72 by solder balls. As described, the ladder-type filter 100 is flip-chip mounted on the printed circuit board 70. The mold resin 76, which seals the ladder-type filter 100, is located on the printed circuit board 70 located in the uppermost layer. According to the third embodiment, the degradation of frequency characteristics of the module 300 is suppressed. In addition, as resonators included in the ladder-type filter 100 are sealed with the mold resin 76 in addition to the sealing portion 24, they are protected more effectively.

Fourth Embodiment

Figure 15B:
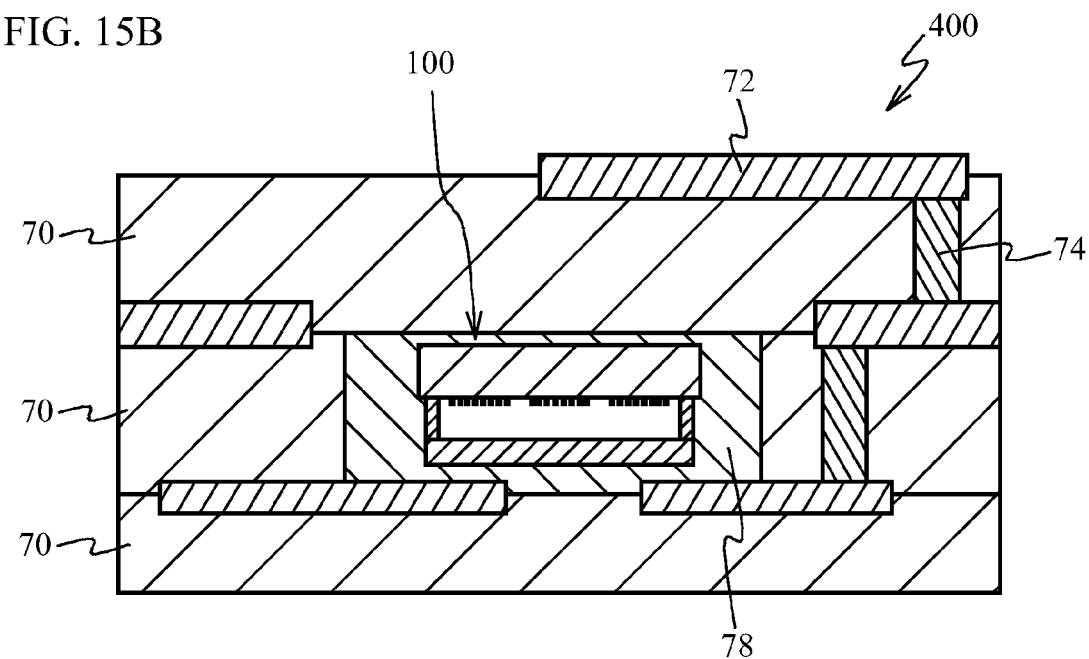
FIG. 15B is a cross-sectional view illustrating a module in accordance with a fourth embodiment.

A fourth embodiment is an example of an acoustic wave device including a ladder-type filter embedded in printed circuit boards. FIG. 15B is a cross-sectional view illustrating the acoustic wave device in accordance with the fourth embodiment. A cross-section of the ladder-type filter 100 in FIG. 15B is taken along line A-A in FIG. 6B.

As illustrated in FIG. 15B, in a module 400 in accordance with the fourth embodiment, the ladder-type filter 100 is embedded in stacked printed circuit boards 70. The ladder-type filter 100 is covered with an insulating portion 78 made of an insulating material such as a resin. The ladder-type filter 100 is sealed and fixed by the insulating portion 78. According to the fourth embodiment, the degradation of frequency characteristics of the module 400 is suppressed. In addition, as resonators included in the ladder-type filter 100 are sealed by the insulating portion 78 in addition to the sealing portion 24 (not illustrated in FIG. 15), they are protected more effectively.

In the third embodiment and the fourth embodiment, the module in which the ladder-type filter 100 is incorporated is used as an example, but the module may include a dual filter, a duplexer or the like. In addition, the module may be a module in which a passive element such as a capacitor, an inductor, and a transmission line is integrated together with a filter.

Although the embodiments of the present invention have been described in detail, it should be understood that the various change, substitutions, and alterations could be made hereto without departing from the spirit and scope of the invention.

What is claimed is:

1. An electronic component comprising:
   a substrate;
   a functional element located on the substrate;
   a wiring located on the substrate and electrically connected to the functional element;
   a metal ceiling located above the functional element so that a space is formed between the metal ceiling and the functional element;
   a sealing portion located on the metal ceiling; and
   a support post that supports the metal ceiling, wherein
   the metal ceiling is electrically connected to a signal wiring that is included in the wiring and transmits a high-frequency signal, and
   the support post electrically connects the metal ceiling to the signal wiring.

2. The electronic component according to claim 1, wherein the functional element is an acoustic wave resonator,
   a first wiring included in the wiring is electrically connected to one end of the acoustic wave resonator, and a second wiring included in the wiring is electrically connected to another end of the acoustic wave resonator, and
   the metal ceiling is electrically connected to the first wiring, and is not electrically connected to the second wiring.

3. The electronic component according to claim 2, wherein each of a plurality of the metal ceilings is located above a respective one of a plurality of the acoustic wave resonators.

4. The electronic component according to claim 2, wherein the metal ceiling is a single metal ceiling located above a plurality of the acoustic wave resonators.

5. The electronic component according to claim 4, wherein a plurality of the support posts electrically connect the single metal ceiling to a third wiring that is electrically connected in common with the plurality of the acoustic wave resonators.

6. The electronic component according to claim 2, wherein a plurality of the acoustic wave resonators are connected in a ladder shape,
   a series resonator included in the plurality of the acoustic wave resonators connected in a ladder shape is connected to the signal wiring, and
   the metal ceiling located above the series resonator is connected to the signal wiring that is electrically connected to the series resonator.

7. The electronic component according to claim 2, wherein the acoustic wave resonator is a surface acoustic wave resonator.

8. The electronic component according to claim 2, wherein the acoustic wave resonator is a piezoelectric thin film resonator.

* * * * *